(12) United States Patent
Green

(10) Patent No.: US 6,654,215 B2
(45) Date of Patent: Nov. 25, 2003

(54) PHOTODETECTOR CIRCUIT WITH AVALANCHE PHOTODIODE

(75) Inventor: Samuel I. Green, St. Louis, MO (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 09/927,153

(22) Filed: Aug. 10, 2001

(65) Prior Publication Data

US 2003/0030951 A1 Feb. 13, 2003

(51) Int. Cl.[7] .............................. H02H 7/06; H02H 9/00
(52) U.S. Cl. ........................................... 361/56; 361/21
(58) Field of Search .............................. 361/21, 56, 24, 361/93.9; 250/214 A, 214 C, 214 R

(56) References Cited

U.S. PATENT DOCUMENTS

| | | | | |
|---|---|---|---|---|
| 3,982,315 A | * | 9/1976 | Kubo | 438/68 |
| 5,013,904 A | * | 5/1991 | Muro | 250/214 R |
| 5,015,839 A | * | 5/1991 | Tanikoshi | 250/214 AG |
| 5,270,533 A | * | 12/1993 | Pulice | 250/214 R |
| 5,589,682 A | * | 12/1996 | Brown et al. | 250/214 R |
| 5,721,424 A | * | 2/1998 | Price | 250/214 R |
| 6,157,022 A | * | 12/2000 | Maeda et al. | 250/214 R |
| 6,166,840 A | * | 12/2000 | Barfod | 359/189 |
| 2002/0131135 A1 | * | 9/2002 | Chow et al. | 359/189 |

* cited by examiner

Primary Examiner—Gregory J. Toatley, Jr.
Assistant Examiner—Danny Nguyen
(74) Attorney, Agent, or Firm—Harness Dickey & Pierce Pierce P.L.C.

(57) ABSTRACT

A photodetector circuit having a power supply and an avalanche photodiode coupled electrically thereto. The power supply includes a first portion, which supplies a substantially constant current, and a second portion, which supplies a substantially constant voltage. At low to moderate optical input signal levels, the substantially constant current that is applied to the avalanche photodiode generates a biasing potential that provides a signal gain, the magnitude of which varies depending upon the optical input signal level. A bias filter between the power supply and the avalanche photodiode slows changes in bias voltage so that the instantaneous photocurrent follows the modulation on the input optical signal. With constant average current bias, the bias potential automatically adjusts with temperature and sample variations to give the same average current flow. The optimum bias current is set depending on the type of avalanche photodiode and the bandwidth and noise characteristics of the following preamplifier.

25 Claims, 6 Drawing Sheets

PHOTODETECTOR CIRCUIT WITH AVALANCHE PHOTODIODE

FIELD OF THE INVENTION

The present invention generally relates to optical receivers and more particularly to an optical receiver having a photodetector circuit that employs an avalanche photodiode.

BACKGROUND OF THE INVENTION

The commercial transceivers that are typically employed in networks generally incorporate a photodiode or photodetector as an optical receiver. Presently, the best-known PIN photodiode detectors have a responsivity on the order of 1 amp/watt or less. Often times, however, better reception sensitivity is desired to overcome issues that result from relatively low transmitter power and signal losses related to the use of connectors. One potential solution is to increase the power of the transmitter. As commercially available transmitters typically have a power level less than −3 dBm (0.5 mW) at 850 nm, the eye-safe power limit at this wavelength, solutions that simply increase the power level of the transmitter are not practicable due to concerns for safety.

A relatively expensive option is to switch to a different wavelength, such as 1300 nm or 1500 nm, where the eye-safe limits increase to about +7 dBm and +17 dBm, respectively.

Substitution of an avalanche photodiode for the PIN photodiode is known to provide better receiver sensitivity due to the electron-multiplication gain of the avalanche photodiode. Avalanche photodiodes are similar to PIN photodiodes except that they have an additional high-field region that provides electron multiplier gain by accelerating photo-generated carriers to sufficient energy to create additional electron-hole pairs by impact ionization that in turn receive sufficient energy to create more electron-hole pairs. Increasing the bias potential increases the potential across the high-field region and increases the amount of gain. The use of an avalanche photodiode, however, presents some problems, including the need to adjust or control the bias potential to maintain both constant response (e.g., over a range of temperatures) and consistent response (i.e., device-to-device).

One popular approach to control the bias of an avalanche photodiode is to measure the temperature proximate the avalanche photodiode and use the temperature measurement to control the avalanche photodiode bias via open loop control. Another known approach is to use a second, unilluminated (i.e., dark) avalanche photodiode on the same monolithic chip operating in breakdown to provide a temperature tracking voltage reference and to bias the first avalanche photodiode at a fixed potential below the reference. Unfortunately, both methods are relatively complex to implement. A less complicated method is to simply fix the bias potential at a voltage that provides a usable responsivity over the full range of variation (e.g., temperature). This results, however, in an output having a magnitude that varies not only with the magnitude of the optical input but also with other variables, such as temperature and sample differences.

Accordingly, there remains a need in the art for an improved photodetector circuit that overcomes the aforementioned problems.

SUMMARY OF THE INVENTION

In one preferred form, the present invention provides a photodetector circuit for processing an optical input signal having an input signal magnitude. The photodetector circuit includes a power supply having an output terminal, a load device having an input terminal, and an avalanche photodiode that is coupled between the output terminal and the input terminal, the avalanche photodiode being configured to process the optical input signal. The power supply has a characteristic load line associated with the generation of a bias potential across the avalanche photodiode. The characteristic load line includes a substantially horizontal portion, which supplies power to the avalanche photodiode with a substantially constant current, and a substantially vertical portion, which supplies power to the avalanche photodiode with a substantially constant voltage. The power supply is configured to change from the first portion of the characteristic load line to the second portion of the characteristic load line when the bias potential across the avalanche photodiode that is generated by the substantially constant current is less than the magnitude of the substantially constant voltage.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Additional advantages and features of the present invention will become apparent from the subsequent description and the appended claims, taken in conjunction with the accompanying drawings, wherein:

DETAILED DESCRIPTION OF THE PREFERRED EMBODIMENTS

Figure 1:
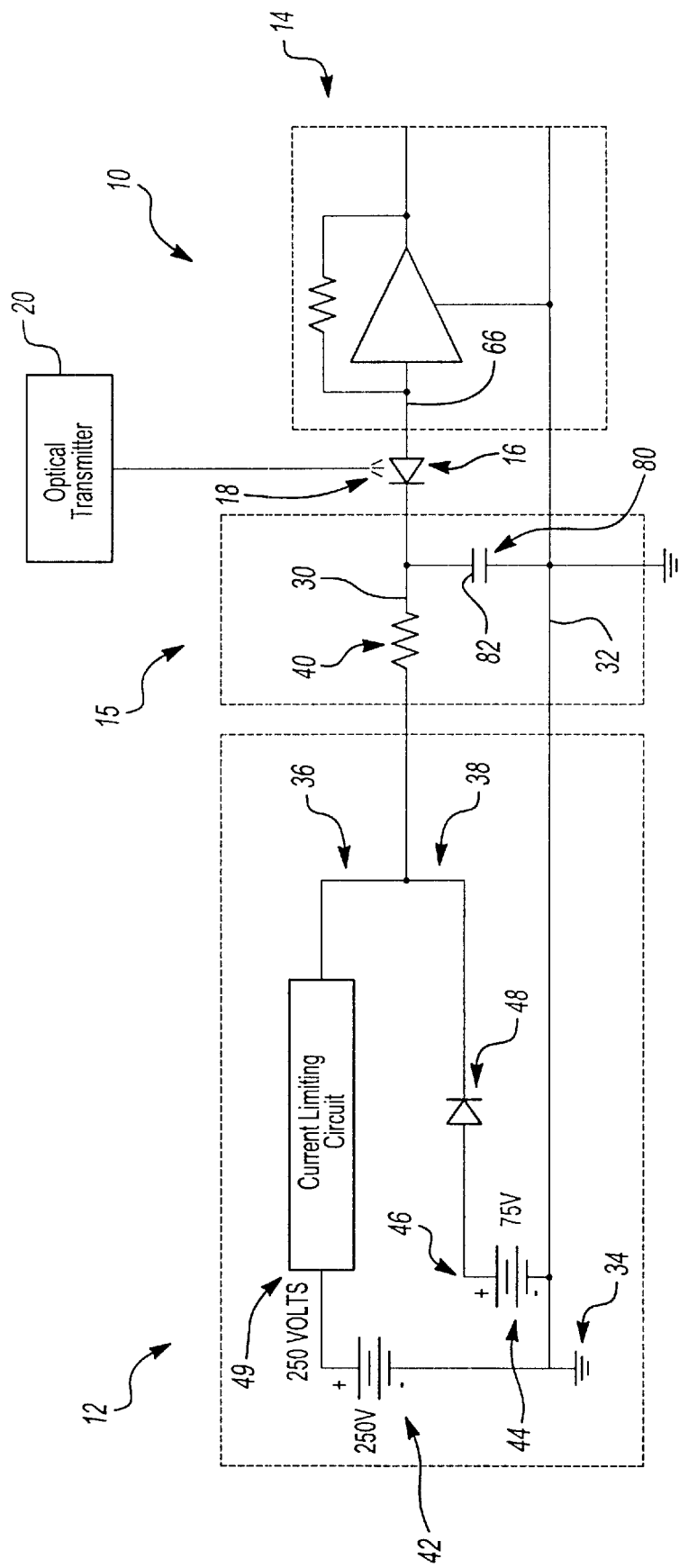
FIG. 1 is a schematic illustration of a photodetector circuit that is constructed in accordance with the teachings of the present invention.

With reference to FIG. 1 of the drawings, a photodetector circuit constructed in accordance with the teachings of the present invention is generally indicated by reference numeral 10. The photodetector circuit 10 is illustrated to include a power supply 12, a load, such as a conventional preamplifier 14, a bias filter 15, and an avalanche photodiode 16. The photodetector circuit 10 is configured to receive an optical input signal 18, which is generated by an optical transmitter 20, and to convert the optical input signal 18 into an electrical output signal. The optical input signal 18 that is provided by the optical transmitter 20 preferably has a constant duty cycle, as opposed to a variable duty cycle where data is transmitted in bursts between periods where no data is transmitted. As those skilled in the art will understand, the optical input signal 18 may be transmitted to the avalanche photodiode 16 via any suitable means, such as a fiber optic cable or through free space.

The power supply 12 is illustrated to include a first output terminal 30 that is coupled to the avalanche photodiode 16, a second output terminal 32 that is coupled to an electrical return or ground 34, a first power supply portion 36 for outputting a supply of power with a substantially constant current and a second power supply portion 38 for outputting a supply of power with a substantially constant voltage. In the particular embodiment illustrated, the first power supply portion 36 is illustrated to include a first voltage source 42 having a voltage that exceeds the breakdown voltage of the avalanche photodiode 16, which is typically about 100 volts to about 300 volts depending upon the avalanche photodiode that is used, and the second power supply portion 38 is illustrated to have a second voltage source 44, which has a lower voltage, which in the example provided is about 75 volts. As those skilled in the art will understand, however, the magnitude of the voltage provided by the first and second voltage sources 42 and 44 will vary depending strongly on the device type. The first and second voltage sources 42 and 44 may be separate supplies as in FIG. 1 or supply 44 may be implemented as a tap 46 on the larger supply 42 as shown in FIG. 2. The second power supply portion 38 also includes a diode clamp 48 so as to provide a lower limit to the combined output potential at the current bias filter resistor 40.

The first power supply portion 36 is shown in FIG. 1 to include a voltage source 42 and a current limiting circuit 49. In the particular example provided in FIG. 2A, the conventional current limiting circuit 49 is shown made with a first transistor 50, a second transistor 52, a first resistor 54 and second resistor 56. Those skilled in the art will understand, however, that the resistance of the first and second resistors 54 and 56 need be tailored to a given application so as to permit a current of a desired magnitude to flow to the avalanche photodiode 16 at low to moderate optical input signal levels.

As those skilled in the art will also understand, the first power supply portion 36 may be constructed somewhat differently. A first alternate embodiment illustrated in FIG. 2B shows the first power supply portion 36' to include a current limiting circuit 49' having a current limiting regulator, such as a current limiting diode 60. A second alternate embodiment, illustrated in FIG. 2C, shows the first power supply portion 36" to include a current limiting circuit 49" having a current limiting resistor 62 having a relatively large resistance, such as 100 megohm. Other well known current limiting circuits may also be substituted for the current limiting circuit 49.

The bias filter 15 is illustrated to include a current bias filter resistor 40 that is coupled to both first and second power supply portions 36 and 38 and a bias filter capacitor 80. The resistance of the current bias filter resistor 40 is selected along with the bias filter capacitor 80 to slow the change in bias potential across the avalanche photodiode 16 and to provide a local source of charge so as allow high frequency operation of the avalanche photodiode 16. The resistance of the current bias filter resistor 40 and capacitance of the capacitor 80 must be tailored to a given application so as to limit the rate of change of the bias potential across the avalanche photodiode 16. In the particular embodiment provided, the current bias filter resistor 40 has a resistance of about 110 kΩ and the bias filter capacitor 80 has a capacitance of 1 nF.

The avalanche photodiode 16 is coupled to the first output terminal of the power supply 12 via the bias filter 15 and to a first input terminal 66 of the preamplifier 14. The operation of the avalanche photodiode 16 is beyond the scope of the present invention and as such, it need not be discussed in detail. Briefly, the avalanche photodiode 16 operates in reverse bias and as such, current flow therethrough is due to dark leakage current, photocurrent generation by detection of optical signal 18, and at high bias potential, to current multiplication gain of the dark current and the photocurrent. The avalanche photodiode 16 produces desirable signal gain when the strength of the electric field is such that carriers in the semiconductor (avalanche photodiode 16) receive electron multiplier gain by the process of impact ionization. It is presently preferred that the avalanche photodiode 16 be controllable to provide a signal gain that may be selectively controlled from an excessively high value, corresponding to breakdown, down to a gain value of unity (1). One such avalanche photodiode having these characteristics is an epitaxial avalanche photodiode.

Figure 2A:
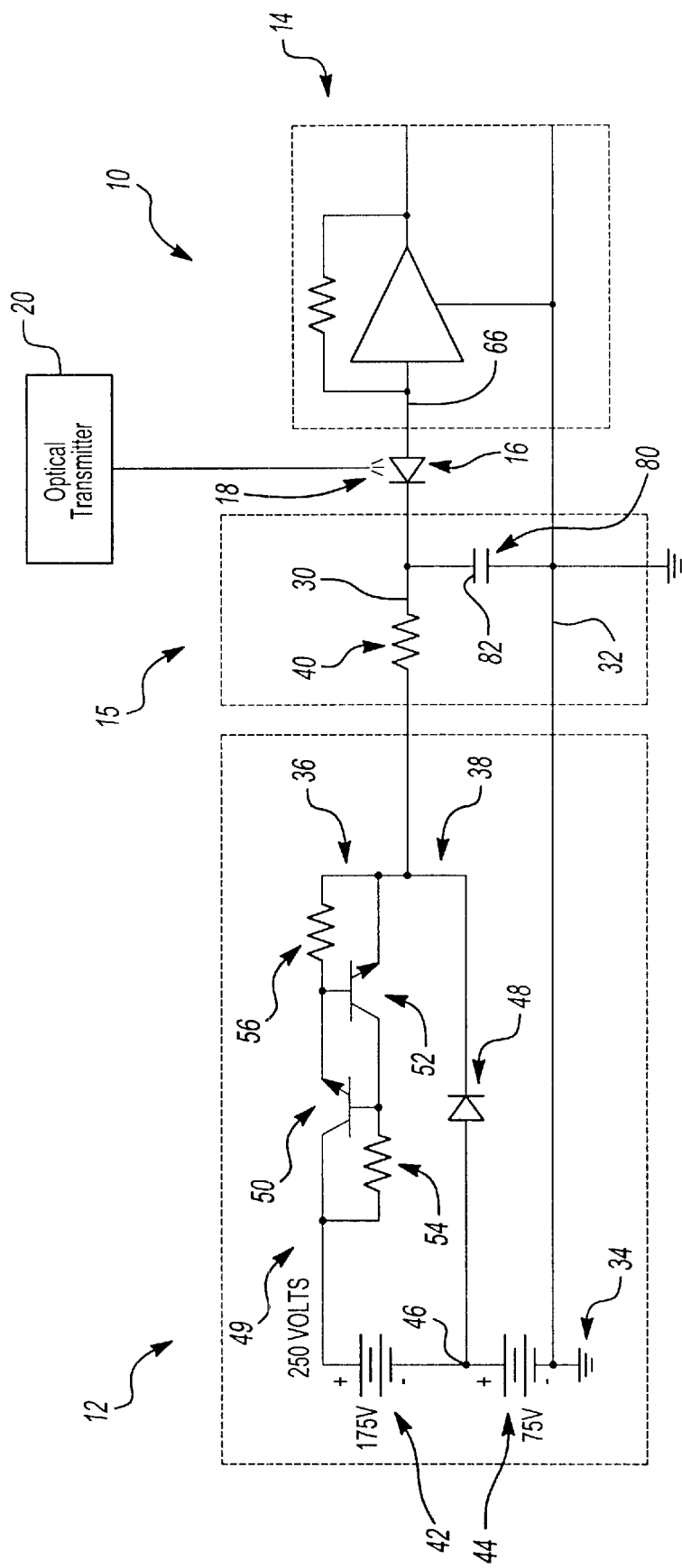
FIG. 2A is a more detailed schematic illustration of a photodetector circuit that is constructed in accordance with the teachings of the present invention.
Figure 2B:
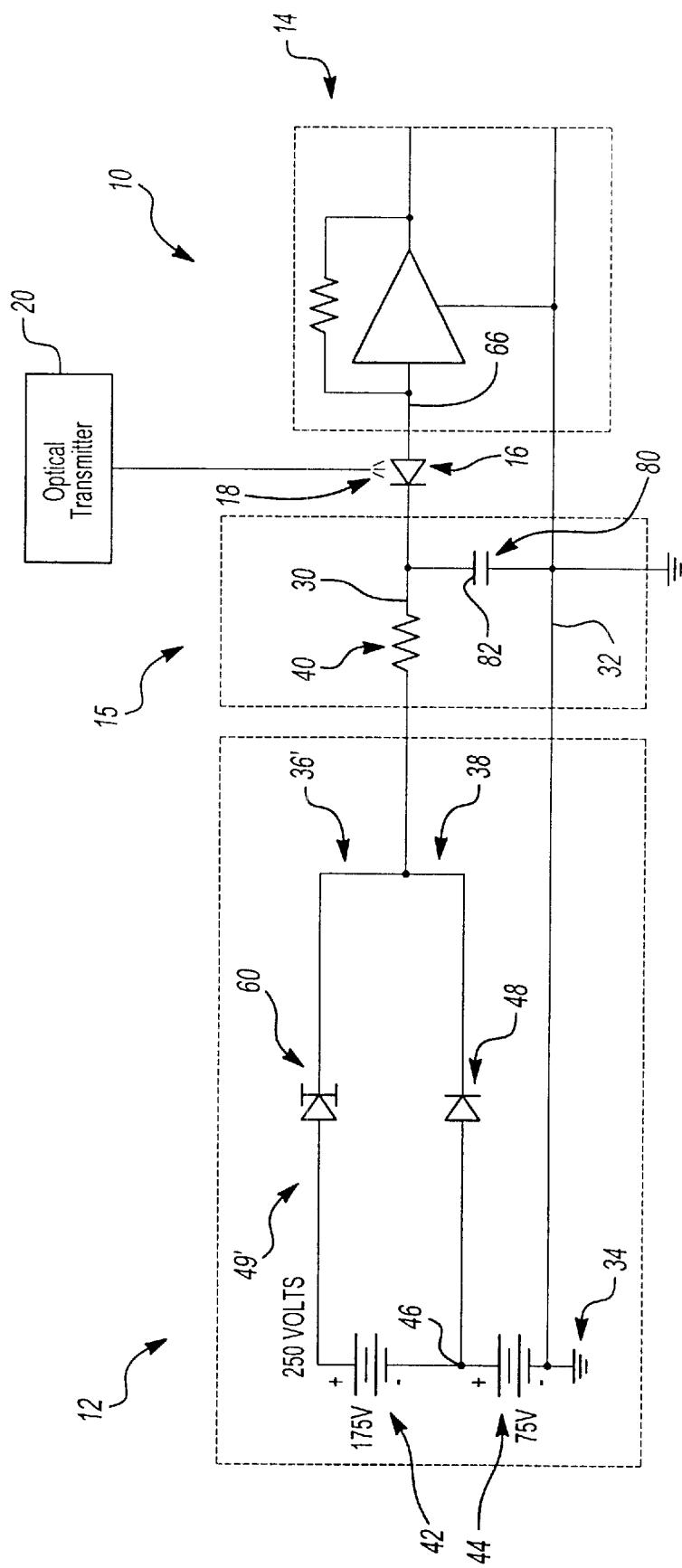
FIG. 2B is a schematic illustration of yet another photodetector circuit constructed in accordance with the teachings of the present invention.
Figure 2C:
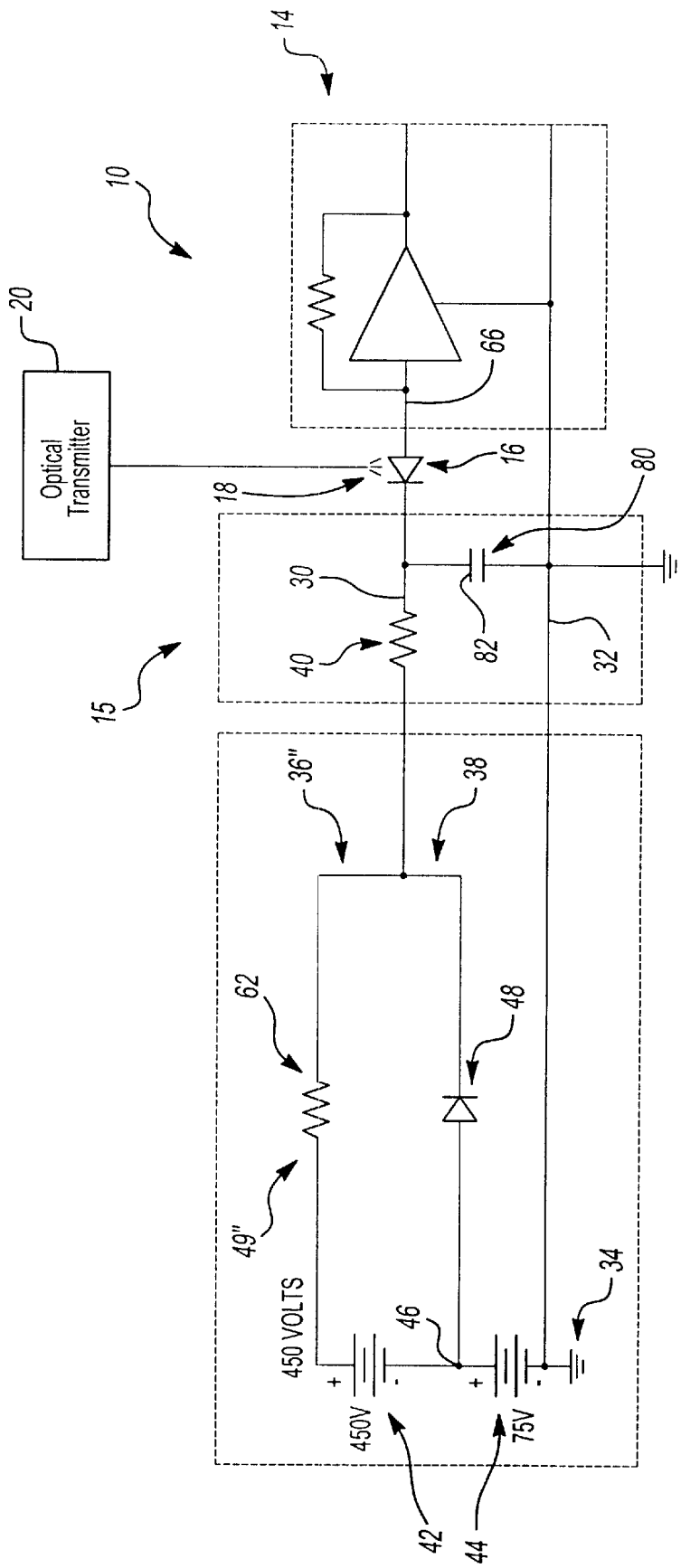
FIG. 2C is a schematic illustration yet another photodetector circuit constructed in accordance with the teachings of the present invention.

With reference to FIGS. 1 and 2A, the power supply 12 is operable for providing a source of power that is used to produce an electric field within the avalanche photodiode 16. When the electric field in a certain region is sufficiently strong, electron multiplier gain is given to dark and photo-generated currents as well as to multiplied currents. Current flow through the avalanche photodiode 16 is initiated when photons of appropriate wavelength from the optical input signal 18 impact the sensitive area of the avalanche photodiode 16. In the embodiment illustrated, the power supply 12 outputs sufficient bias potential to generate a region within the avalanche photodiode 16 that is fully depleted wherever photo-generated carriers or multiplied carriers may occur, so that current flow is substantially completely via high-speed drift. Depending on the relevant design parameters, however, the power supply 12 may be configured to provide lower output voltage so that regions within the avalanche photodiode 16 may be less than fully depleted where carriers occur and thereby permit current flow via a combination of high speed drift and relatively lower speed diffusion, resulting in degraded speed of response and waveform fidelity.

The power supply 12 operates such that the first power supply portion 36 supplies a substantially constant current to the avalanche photodiode 16. The magnitude of the substantially constant current is such that a bias potential appears across the avalanche photodiode 16 that drives the avalanche photodiode 16 into breakdown when the avalanche photodiode 16 is not exposed to an optical input signal 18 (i.e., when the avalanche photodiode 16 is dark). Configuration in this manner ensures that current flow with sufficient signal gain will occur when the avalanche photodiode 16 is exposed to an optical input signal 18 having a relatively low signal level. The magnitude of the constant current setting is preferentially chosen to provide best performance at the lowest preferred input optical signal level. The constant current set point selected in this manner is observed to vary little over temperature and from device to device and to exhibit high tolerance to set point inaccuracy. As the signal level of the optical input signal 18 increases, the current through the avalanche photodiode changes from multiplied dark current, which is all noise, to multiplied signal photocurrent, which is modulated data and an amount of noise that varies according the signal level of the optical input signal 18. The bias potential across the avalanche photodiode 16 that is generated by the substantially constant current decreases as the level of the optical input signal 18 increases and as such, signal gain is automatically adjusted according to the signal level of the optical input signal 18.

As the bias potential across the avalanche photodiode 16 changes inversely with the signal level of the optical input signal 18, exposure of the avalanche photodiode 16 to an optical input signal 18 of a sufficiently high signal level would cause the bias potential that is generated by the substantially constant current provided by the first power supply portion 36 to fall below that which is necessary to maintain full depletion in the region where photo-generated carriers appear. The narrowing of the depletion region to a width that is smaller than the desired width causes the performance of the photodetector circuit 10 to degrade in an unsatisfactory manner. To negate this effect, the second power supply portion 38 maintains the bias potential that is applied to the avalanche photodiode 16 at a predetermined minimum bias level. In the particular embodiment provided, the predetermined minimum bias level has a magnitude that is several volts (e.g., from about 0.5 volt to about 10 volts) above the minimum voltage that is necessary to maintain the width of the depletion region at a spacing that provides full depletion and substantially all current flow via drift. As mentioned above, however, the predetermined minimum bias level is related to various design parameters, such as minimum levels for both speed of response and fidelity, and as such, the predetermined minimum bias level may correspond to a voltage that permits current flow via a combination of drift and diffusion, as some applications may usefully tolerate some loss of speed of response.

Figure 3:
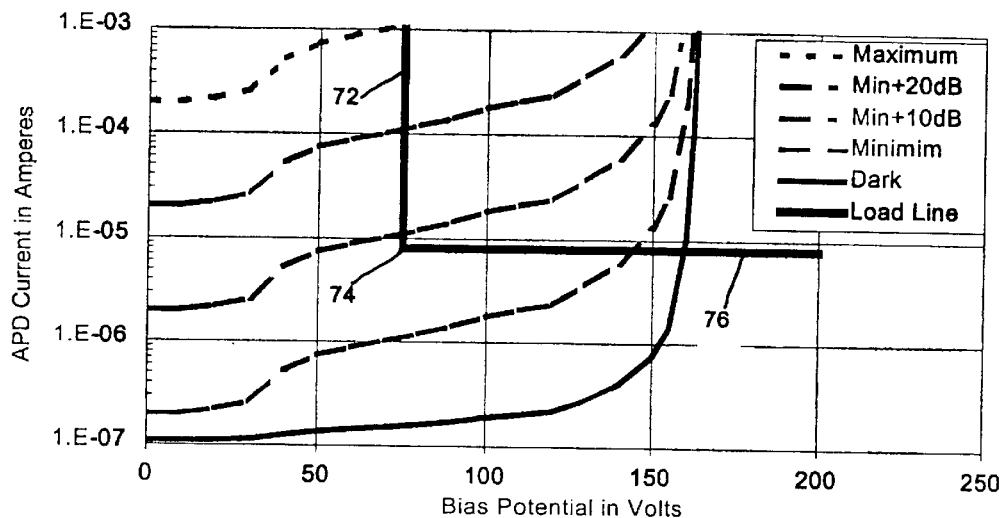
FIG. 3 is a plot illustrating the characteristic load line of the power supply as a function of current and bias potential.

FIG. 3 illustrates the operation of the power supply 12 using a characteristic load line 74 to show the relationship between the bias potential and the bias current that is applied to the avalanche photodiode 16. As those skilled in the art will understand, the characteristic load line 74 includes a first portion 76, which is substantially horizontal and corresponds to the provision of a substantially constant current, and a second portion 72, which is substantially vertical and corresponds to the provision of a substantially constant voltage.

In the particular embodiment illustrated, the photodetector circuit 10 also includes a secondary power source 80 that is electrically coupled to the avalanche photodiode 16. As those skilled in the art will appreciate, the bias potential that appears across the avalanche photodiode 16 diminishes briefly when optical signals of suitable wavelength impact the active area of the avalanche photodiode 16 to generate photocurrent. A true current source power supply would force an exact constant current through the avalanche photodiode 16 and effectively remove any signal modulation. The secondary power source 80 is employed to provide a very short-term source of substantially constant voltage bias potential across the avalanche photodiode 16 to allow the photocurrent to follow the modulation encoded onto the optical signal 18 while the current through the avalanche photodiode 16 is constant on a longer time scale, corresponding to many data bits or slower than the lowest modulation frequency components. In the example provided, the secondary power source is a capacitor 80, which has a capacitance of about 1 nF and maintains the bias potential across the avalanche photodiode 16 substantially constant for periods extending over many data bits by preventing the bias from changing rapidly.

Figure 4:
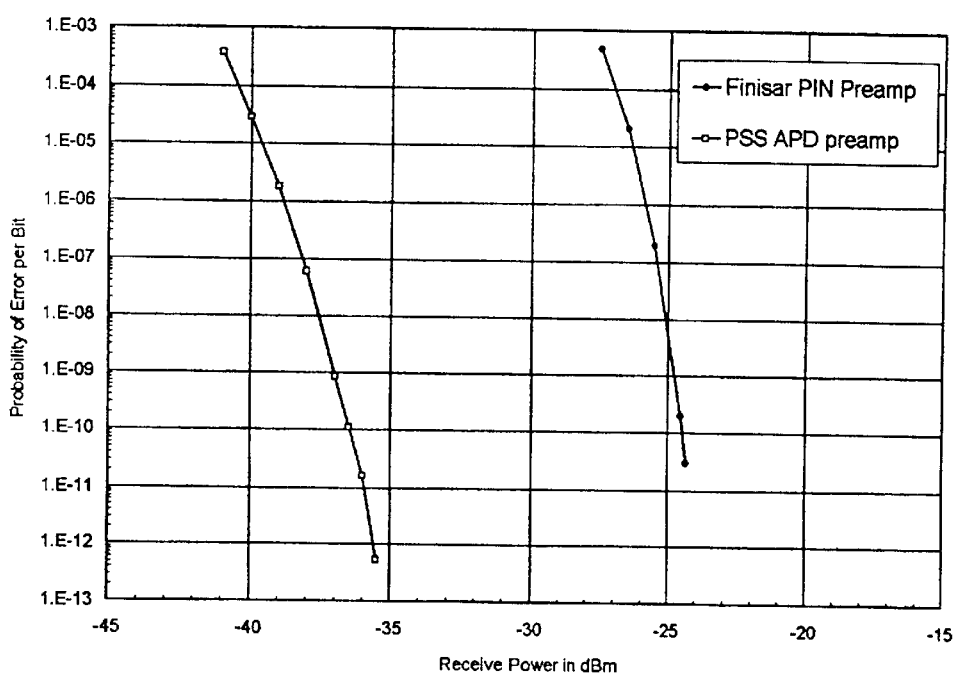
FIG. 4 is a plot that illustrates the sensitivity of the photodetector circuit of FIG. 1 as compared with the sensitivity of a conventional photodetector circuit that utilizes a PIN photodiode.
Figure 5:
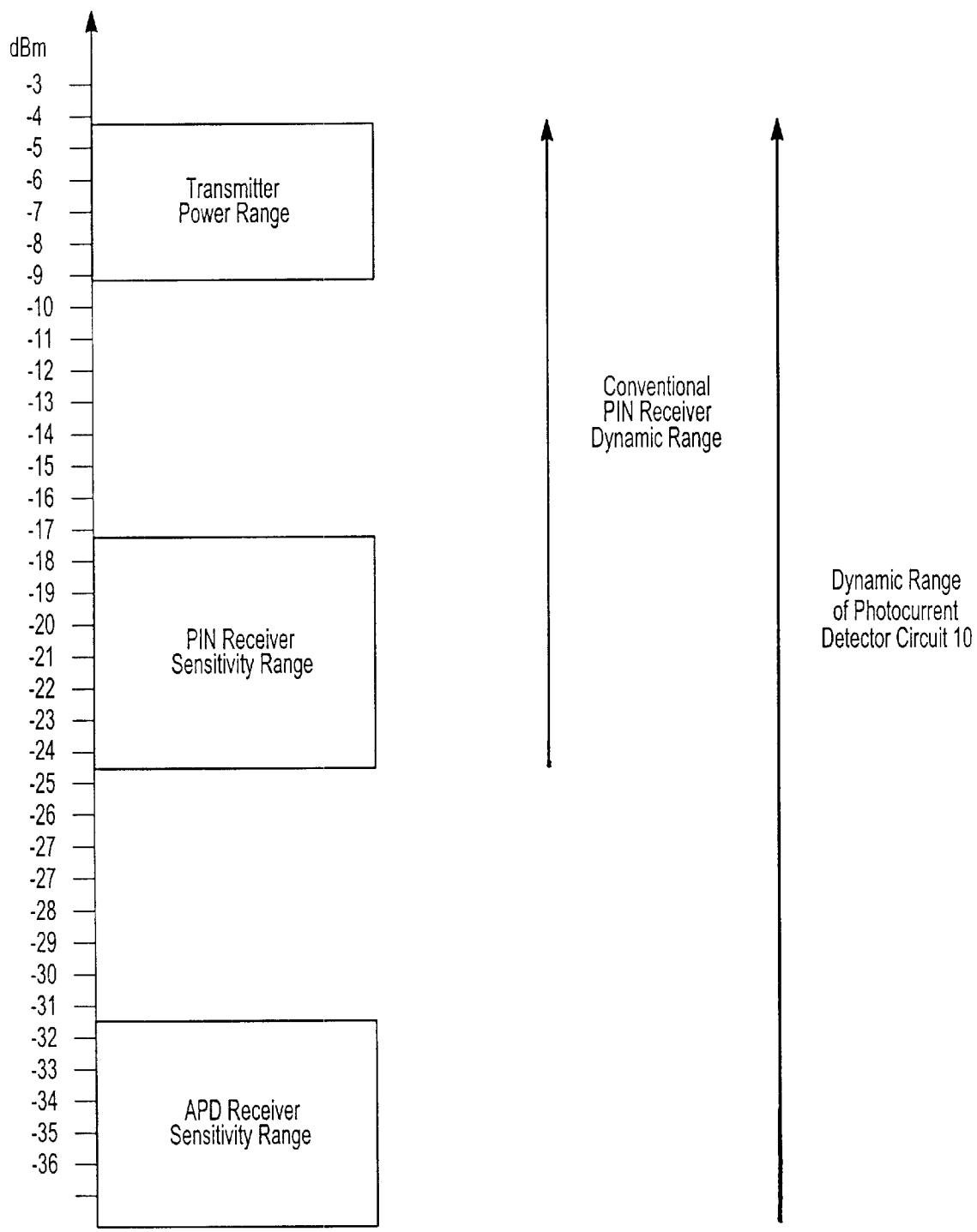
FIG. 5 is a plot that illustrates the dynamic range of the photodetector circuit of FIG. 1 as compared with the dynamic range of a conventional photodetector circuit that utilizes a PIN photodiode.

Construction of the photodetector circuit 10 in this manner is highly advantageous in that the photodetector circuit 10 requires no control for changes in temperature or signal level of the optical input signal 18. Furthermore, both sensitivity and dynamic range are improved as compared to other known photodetector circuits that utilize PIN photodiodes or other comparable photodetectors or avalanche photodiodes with other biasing means. Improvements in sensitivity and dynamic range are illustrated in FIGS. 4 and 5, respectively.

A primary feature of this biasing scheme is the benefit of automatic bias optimization that occurs with constant current bias. Conventionally, constant bias potential is set to a very narrow optimum range and must be reset when temperature changes or sample devices are replaced. The range for near optimum performance may be smaller than 1% of the bias potential. With constant current bias, the bias potential automatically adjusts with temperature and sample variations to give the same current flow. The optimum bias current depends on the type of avalanche photodiode and the bandwidth and noise characteristics of the following preamplifier. A large +/−50% change in the actual set current causes very little change in performance. The only feature lacking is that the output signal amplitude is not proportional to the input. Rather output signal amplitude is automatically constrained into a desirable limited range.

While the invention has been described in the specification and illustrated in the drawings with reference to a preferred embodiment, it will be understood by those skilled in the art that various changes may be made and equivalents may be substituted for elements thereof without departing from the scope of the invention as defined in the claims. In addition, many modifications may be made to adapt a particular situation or material to the teachings of the invention without departing from the essential scope thereof. Therefore, it is intended that the invention not be limited to the particular embodiment illustrated by the drawings and described in the specification as the best mode presently contemplated for carrying out this invention, but that the invention will include any embodiments falling within the foregoing description and the appended claims.

What is claimed is:

1. A photodetector circuit for processing an optical input signal having an input signal magnitude, the photodetector circuit comprising:

a power supply having an output terminal;

a load device having an input terminal; and an avalanche photodiode coupled between the output terminal and the input terminal, the avalanche photodiode being configured to process the optical input signal;

wherein the power supply has a characteristic load line associated with the generation of a bias potential across the avalanche photodiode, the characteristic load line including a substantially horizontal portion for supplying power to the avalanche photodiode with a substantially constant current, the characteristic load line also including a substantially vertical portion for supplying power to the avalanche photodiode with a substantially constant voltage, the power supply being configured to change from a first portion of the characteristic load line to a second portion of the characteristic load line when the bias potential across the avalanche photodiode that is generated by the substantially constant current has a magnitude that is less than a magnitude of the substantially constant voltage.

2. The photodetector circuit of claim 1, wherein the avalanche photodiode is an epitaxial avalanche photodiode.

3. The photodetector circuit of claim 1, further comprising a supplemental power source coupled to the avalanche photodiode, the supplemental power source being operable for maintaining the bias potential across the avalanche photodiode substantially constant for brief periods by preventing the bias from changing rapidly.

4. The photodetector circuit of claim 3, wherein the supplemental power source is a capacitor to store electric charge.

5. The photodetector circuit of claim 1, wherein the power supply includes a first portion for producing the substantially constant current and a second portion for producing the substantially constant voltage, the second portion including a second voltage source and with a diode clamp electrically coupled thereto.

6. The photodetector circuit of claim 5, wherein the first portion is a constant current source that includes a first voltage source and a current limiting circuit.

7. The photodetector circuit of claim 6, wherein the current limiting circuit includes a pair of transistors and a pair of resistors.

8. The photodetector circuit of claim 5, wherein the first portion includes a first voltage source and a current limiting diode, the current limiting diode being coupled in series with the first voltage source.

9. The photodetector circuit of claim 5, wherein the first portion includes a first voltage source and a current limiting resistor, the current limiting resistor being coupled in series with the first voltage source.

10. The photodetector circuit of claim 1, wherein the avalanche photodetector circuit is configured to provide a gain having a magnitude that is varied in a predetermined manner from a value of unity (1) to a high gain value having a magnitude that is greater than unity.

11. The photodetector circuit of claim 1, wherein the substantially constant voltage has a magnitude that generates a region within the avalanche photodiode that is at least partially depleted such that current flow through the avalanche photodiode occurs at least partially via drift.

12. The photodetector circuit of claim 11, wherein the region is substantially fully depleted such that current flow through the avalanche photodiode occurs substantially completely via drift.

13. A photodetector circuit for processing an optical input signal having an input signal magnitude, the photodetector circuit comprising:

a power supply having an output terminal;

a load device having an input terminal; and an avalanche photodiode coupled between the output terminal and the input terminal, the avalanche photodiode being configured to process the optical input signal;

wherein the power supply has a characteristic load line associated with the generation of a bias potential across the avalanche photodiode, the characteristic load line including a substantially horizontal portion for supplying power to the avalanche photodiode with a substantially constant current, the characteristic load line also including a substantially vertical portion for supplying power to the avalanche photodiode with a substantially constant voltage, the power supply being configured to change from a first portion of the characteristic load line to a second portion of the characteristic load line in response to receipt by the avalanche photodiode of an optical input signal having a high signal level; and wherein, in response to the high signal level, the bias potential across the avalanche photodiode that is generated by the application of the substantially constant current thereto has a magnitude that is less than a predetermined minimum bias level.

14. The photodetector circuit of claim 13, wherein the avalanche photodiode is an epitaxial avalanche photodiode.

15. The photodetector circuit of claim 13, further comprising a supplemental power source coupled to the avalanche photodiode, the supplemental power source being operable for maintaining the bias potential across the avalanche photodiode substantially constant for brief periods extending over a plurality of data bits to prevent the bias potential from changing rapidly.

16. The photodetector circuit of claim 15, wherein the supplemental power source is a capacitor to store electric charge.

17. The photodetector circuit of claim 13, wherein the power supply includes a first portion for producing the substantially constant current and a second portion for producing the substantially constant voltage, the second portion including a voltage source with a diode clamp electrically coupled thereto.

18. The photodetector circuit of claim 17, wherein the first portion is a constant current source that includes a first voltage source and a current limiting circuit.

19. The photodetector circuit of claim 18, wherein the current limiting circuit includes a pair of transistors and a pair of resistors.

20. The photodetector circuit of claim 17, wherein the first portion includes a second voltage source and a current limiting diode, the current limiting diode being coupled in series with the second voltage source.

21. The photodetector circuit of claim 17, wherein the first portion includes a second voltage source and a current limiting resistor, the current limiting resistor being coupled in series with the second voltage source.

22. The photodetector circuit of claim 13, wherein the avalanche photodetector circuit is configured to provide a gain having a magnitude that is varied in a predetermined manner from a value of unity (1) to a high gain value having a magnitude that is greater than unity.

23. The photodetector circuit of claim 13, wherein the substantially constant voltage has a magnitude that generates a region within the avalanche photodiode that is at least partially depleted such that current flow through the avalanche photodiode occurs at least partially via drift.

24. The photodetector circuit of claim 23, wherein the region is substantially fully depleted such that current flow through the avalanche photodiode occurs substantially completely via drift.

25. A photodetector circuit for processing an optical input signal having an input signal magnitude, the photodetector circuit comprising:

a power supply having an output terminal;

a load device having an input terminal; and an avalanche photodiode coupled between the output terminal and the input terminal, the avalanche photodiode being configured to process the optical input signal;

wherein the power supply has means for providing a substantially constant current and means for providing a substantially constant voltage, the power supply being configured to change from the substantially constant current providing means to the substantially constant voltage providing means in response to receipt by the avalanche photodiode of an optical input signal having a high signal level;

wherein, the substantially constant voltage generates a load line having a substantially vertical portion; and wherein, in response to the high signal level, the bias potential across the avalanche photodiode that is generated by the application of the substantially constant current thereto has a magnitude that is less than a predetermined minimum bias level.

* * * * *